(12) United States Patent
Bi et al.

(10) Patent No.: US 10,103,278 B2
(45) Date of Patent: Oct. 16, 2018

(54) SILICON IMPATT DIODE

(71) Applicant: Texas Instruments Incorporated, Dallas, TX (US)

(72) Inventors: Xiaochuan Bi, Sunnyvale, CA (US); Tracey L. Krakowski, Palo Alto, CA (US); Doug Weiser, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/204,030

(22) Filed: Jul. 7, 2016

(65) Prior Publication Data
US 2016/0322511 A1 Nov. 3, 2016

Related U.S. Application Data

(63) Continuation of application No. 14/327,157, filed on Jul. 9, 2014, now Pat. No. 9,412,879.

(60) Provisional application No. 61/847,742, filed on Jul. 18, 2013.

(51) Int. Cl.
H01L 29/66 (2006.01)
H01L 29/864 (2006.01)
H01L 27/06 (2006.01)
H01L 29/06 (2006.01)
H01L 29/161 (2006.01)
H01L 29/165 (2006.01)

(52) U.S. Cl.
CPC ........ H01L 29/864 (2013.01); H01L 27/0635 (2013.01); H01L 29/0649 (2013.01); H01L 29/161 (2013.01); H01L 29/66159 (2013.01); H01L 29/165 (2013.01)

(58) Field of Classification Search
None
See application file for complete search history.

(56) References Cited

U.S. PATENT DOCUMENTS

| | | |
|---|---|---|
| 3,649,386 A | 3/1972 | Murphy |
| 3,896,478 A | 7/1975 | Henry |
| 4,030,943 A | 6/1977 | Lee et al. |
| 4,064,620 A | 12/1977 | Lee et al. |
| 4,230,505 A | 10/1980 | Wu et al. |
| 4,596,070 A | 6/1986 | Bayraktaroglu |
| 4,692,791 A | 9/1987 | Bayraktaroglu |
| 4,857,972 A | 8/1989 | Jorke et al. |
| 4,859,633 A | 8/1989 | Bayraktaroglu |
| 6,660,616 B2 | 12/2003 | Babcock et al. |
| 6,774,460 B1 | 8/2004 | Herbert et al. |
| 8,816,443 B2 | 8/2014 | Augusto et al. |
| 2002/0100950 A1 | 8/2002 | Babcock et al. |

(Continued)

FOREIGN PATENT DOCUMENTS

| | | |
|---|---|---|
| CN | 1482680 | 3/2004 |
| CN | 1812120 | 8/2005 |

OTHER PUBLICATIONS

"Monolithic Integrated Coplanar Oscillator 90GHz With Silicon IMPATT Diode," ICMMT2008 Proceedings, Institute for Semiconductor Engineering, University Stuttgart, Stuttgart, Germany, pp. 1-4 (Xu, et al.), Apr. 22, 2008.

(Continued)

Primary Examiner — David E Graybill
(74) Attorney, Agent, or Firm — Ronald O. Neerings; Charles A. Brill; Frank D. Cimino

(57) ABSTRACT

A method to integrate a vertical IMPATT diode in a planar process.

19 Claims, 7 Drawing Sheets

(56) References Cited

U.S. PATENT DOCUMENTS

2003/0168701 A1    9/2003  Voldman
2007/0290265 A1   12/2007  Augusto et al.

OTHER PUBLICATIONS

International Search Report in corresponding PCT Application No. PCT/US2014/047298, dated Nov. 20, 2014 (2 pages).
"IMPATT Diode," Wikipedia Definition, Jul. 1, 2014, pp. 1-4.
"A 77GHz Monolithic IMPATT Transmitter in Standard CMOS Technology," Microwave Symposium Digest, 2005 IEEE MTT-s International, Jun. 12-17, 2005, Center mfpr Integrated Systems, Stanford University, California, pp. 1-4 (Al-Attar, et al.).

SILICON IMPATT DIODE

CROSS-REFERENCE TO RELATED APPLICATIONS

This continuation application claims the benefit of priority under 35 U.S.C. § 120 to U.S. patent application Ser. No. 14/327,157, filed on Jul. 9, 2014, which also claims the benefit of priority, under 35 U.S.C. § 119(e) of U.S. Provisional Application 61/847,742, filed on Jul. 18, 2013. The entirety of the above referenced applications are hereby incorporated herein by reference.

FIELD OF THE INVENTION

This invention relates to the field of semiconductor devices. More particularly, this invention relates to integration of the IMPact Avalanche Transit-Time (IMPATT) diode into the analog technology.

BACKGROUND OF THE INVENTION

The IMPATT diode is a 2-terminal device with typical applications in the area of radio frequency (RF) power generation and amplification. Compared to a 3-terminal device approach, the IMPATT diode can be fabricated to have very small resistive loss and parasitic capacitance. Therefore, the IMPATT diode can generate high RF power at high frequency, making it especially useful for the Terahertz (>300 GHz) applications.

A conventional n-type IMPATT diode, as shown in FIG. 1 consists of three distinct regions, a heavily doped P++ region 101 for avalanche breakdown, a lightly doped N region 102 for charge drift, and a heavily doped N++ region 103 for charge collection. When the diode is reverse biased, the free electrons inside the N region are depleted from the device, creating a peak electrical field at the P++/N junction. When the reverse DC bias increases, the peak electrical field increases, until one of two breakdown processes occurs. In one process, the field may be so high that it exerts sufficient force on a covalently bound electron to free it. This creates two carriers, a hole and an electron to contribute to the current. This breakdown is called Zener breakdown or tunneling breakdown. In the second breakdown process, the residual free carriers are able to gain enough energy from the electrical field and break covalent bond in the lattice. This process is called avalanche breakdown, and every carrier interacting with the lattice as described above creates two additional carriers. All three carriers can then participate in further avalanching collisions, leading to a sudden multiplication of carriers in the space-charge region when the maximum filed becomes large enough to cause avalanche.

Once the carriers are created by breakdown in the high field region, the holes will flow out of the device from the top Ohmic contact, resulting in DC current. The electrons will travel across the N region (drift region) 102 and flow out of the device through the bottom Ohmic contact. With proper designed doping profile, the electrical field in the N region 102 will be high enough that all the electrons will move at their saturation velocity $v_{sat}$. Since the thickness of N region is nonzero, the electrons take finite time, called transit-time, to flow out of the device. Under alternating current (AC) condition, the diode AC current, coming from the moving electrons within the device, can lag behind the AC voltage applied on the diode, resulting in phase delay between AC current and AC voltage. In the IMPATT diode, the thickness of the N region (drift region) is designed properly to create 180 degree phase delay, therefore the diode shows negative resistance. Once such diode is connected with a resonant circuit, the diode negative resistance can create oscillation and generate RF power.

Typically, a silicon IMPATT diode is fabricated vertically in mesa structure, as in Henry's U.S. Pat. No. 3,896,478. Similar structures are also disclosed in Henry's U.S. Pat. No. 3,649,386 and Lee's U.S. Pat. Nos. 4,030,943 and 4,064,620. Such mesa structures are still widely used in recent works. Bayraktaroglu, from TI (Texas Instruments), disclosed a slightly different approach, as in U.S. Pat. No. 4,596,070, to fabricate the IMPATT diode where polyimide is used to isolate different active diodes.

Two major source of series parasitic resistance must be minimized, and these resistances are: 1) contact resistance at the substrate contact metal interface; 2) series resistance of the substrate modified by skin effect. Contact resistance is reduced by maximizing the effective doping level in the substrate at the contact surface either by maintaining a high level of substrate doping or by contact alloying. Minimizing substrate resistivity also reduces the skin effect contribution to the series resistance. To minimize series resistance, the diode substrate is thinned to micrometer range.

The discrete mesa shape IMPATT diode in FIG. 1 becomes difficult to adopt at Terahertz regime. In this frequency range, an optimized diode should have a diode diameter smaller than 5 um. It is challenge to fabricate such small diode with thinned substrate, and still be able to assemble the package with desired electrical property, good reproducibility, and long term reliability. Therefore an integrated IMPATT diode fabrication technique is needed to solve the above challenges.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In accordance with an embodiment of the present application, a vertical IMPATT diode fabricated in a standard planar analog process flow. The vertical IMPATT diode fabricated in a standard planar analog process flow comprises: a substrate composed of p-type single crystal silicon; an n-type buried layer touching the top surface of the substrate; an un-doped layer touching the top surface of the n-type buried layer; a deep trench extending down to the substrate and completely surrounding the IMPATT diode and separating the diode from the rest of the elements in an analog circuit; a shallow trench layer coveting the top surface of the wafer, wherein openings are included to provide for $P^{++}$ and $N^{++}$ areas of the IMPATT diode; an n-well extending through the $P^{++}$ opening in the shallow trench layer into the un-doped layer and touching the top surface of the n-type buried layer; a deep n+ area partially separated from the n-well by a shallow trench structure, wherein the deep n+ area extends through the $N^{++}$ opening in the shallow trench layer into the un-doped layer touching the top surface of the n-type buried layer; a layer of material touching the top of the n-well selected from the group of highly doped p+ silicon, p+ type SiGe, a composite layer of highly doped p+ silicon on n+ silicon, a composite layer of highly doped p+ silicon on n-type SiGe or a composite layer of p-type SiGe on n-type SiGe; and ohmic contacts separated from each other by a first inter-level dielectric material and separately touching the highly doped n+ layer and the layer of material touching the top of the n-well.

In accordance with another embodiment of the present application, a method of forming a vertical IMPATT diode in a standard planar analog process flow. The method of forming a vertical AWAIT diode in a standard planar analog process flow comprising: providing a substrate composed of p-type single crystal silicon; epitaxially depositing an n-type buried layer overlaying and touching the top surface of the substrate; epitaxially depositing an un-doped layer overlaying and touching the top surface of the n-type buried layer; forming a deep trench extending down to the substrate and completely surrounding the IMPATT diode and separating the diode from the rest of the elements in an analog circuit; forming a shallow trench layer covering the top surface of the wafer, wherein openings are included to provide for $P^{++}$ and $N^{++}$ areas of the IMPATT diode; forming an n-well extending through the $P^{++}$ opening in the shallow trench layer into the un-doped layer and touching the top surface of the n-type buried layer; forming a deep n+ area partially separated from the n-well by a shallow trench structure, wherein the deep n+ area extends through the un-doped layer and touches the top surface of the n-type buried layer; forming a layer of material touching the top of the n-well selected from the group of highly doped p+ silicon, p-type SiGe, a composite layer of highly doped p+ silicon on n+ silicon, a composite layer of highly doped p+ silicon on n-type SiGe or a composite layer of p-type SiGe on n-type SiGe; and forming ohmic contacts separated from each other by a first inter-level dielectric material and separately touching the highly doped n+ layer and the layer of material touching the top of the n-well.

DESCRIPTION OF THE VIEWS OF THE DRAWING

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
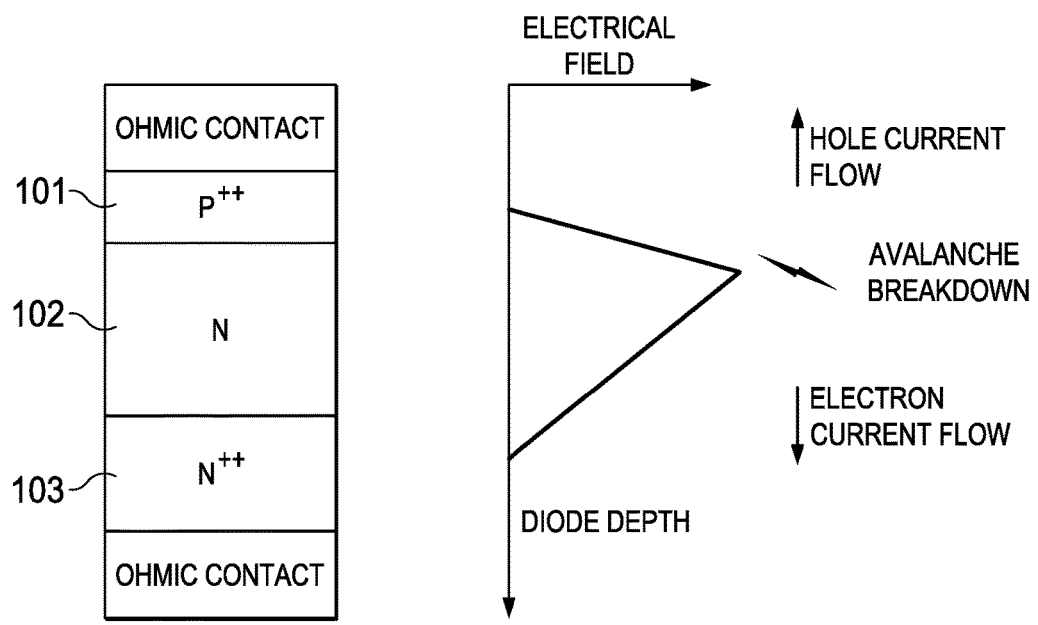
FIG. 1 is a cross section of a typical IMPATT diode.

The IMPATT diode FIG. 1 consists of three distinct regions, a heavily doped $P^{++}$ 101 region for breakdown, a lightly doped N region 102 for charge drift, and a heavily doped $N^{++}$ region 103 for charge collection. The diode is reverse biased at breakdown condition, and holes are generated by avalanche in the high field region between $P^{++}$ and N layers. The electrical field in the N region is high enough for the holes to move at saturation velocity but low enough to prevent the additional charges from being created by impact ionization. The holes finally reach the low field $N^{++}$ region and are absorbed by the bottom Ohmic contact.

Typically, a silicon IMPATT diode is fabricated vertically in a mesa structure. Although this solution works, it cannot be integrated with modern analog processing.

Figure 2:
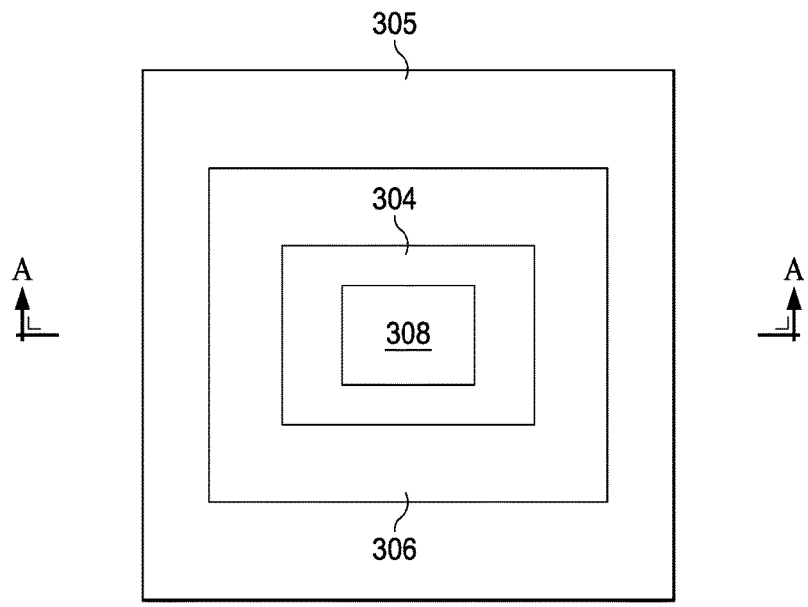
FIG. 2 is a plan view of an IMPATT diode detailing the structure below the first metal level and the first inter-level dielectric material according to the embodiments of the present invention shown in FIGS. 3-9.

FIG. 2 is a plan view of an IMPATT diode detailing the structure below the first metal level 401 and the first inter-level dielectric material 402 according to the embodiments of the present invention shown in FIGS. 3-9.

Figure 3:
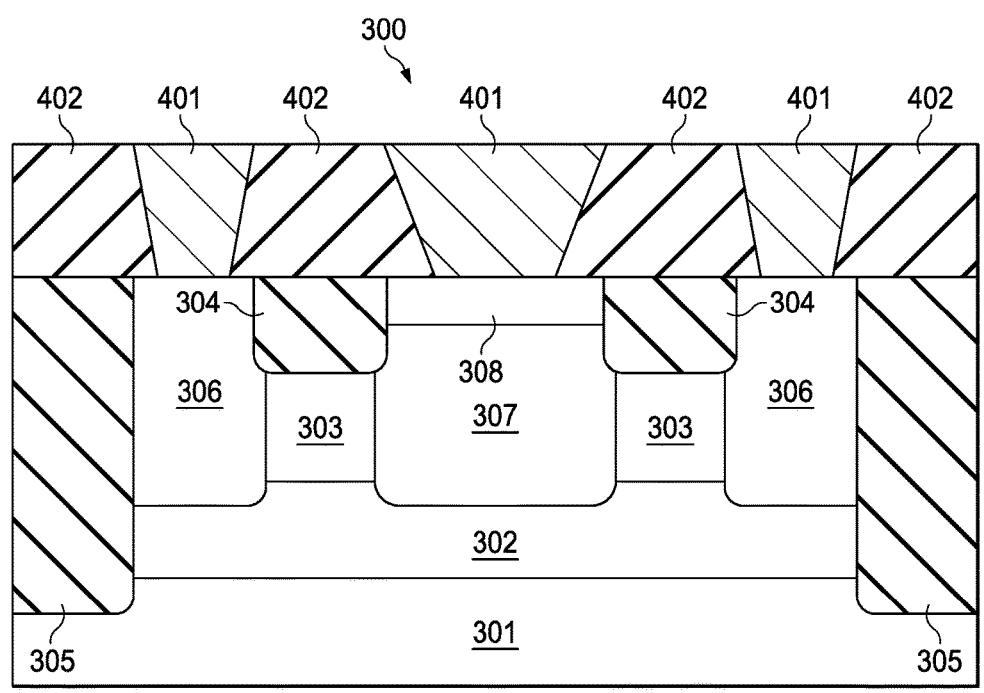
FIG. 3 is a cross section through section A-A of FIG. 2 of an IMPATT diode according to an embodiment of the present invention.

FIG. 3 depicts a partial sectional depiction of a semiconductor substrate with an n-type IMPATT diode embodying the present invention.

FIGS. 3A through 3D illustrate various parts of a process that can be utilized to fabricate an IMPATT diode in accordance with an aspect of the present invention. Those skilled in the art will understand and appreciate that many or all portions of the process can be implemented with a bipolar or Bi-CMOS process. Additionally, while the following process steps will be described mainly with respect of forming an n-type IMPATT diode, those skilled in the art will understand and appreciate that a p-type IMPATT diode can also could be fabricated in accordance with an aspect of the present invention. Additionally, it is to be understood and appreciated that the particular order shown in the figures can be deviated and still produce an IMPATT diode in accordance with an aspect of the present invention.

Figure 3A:
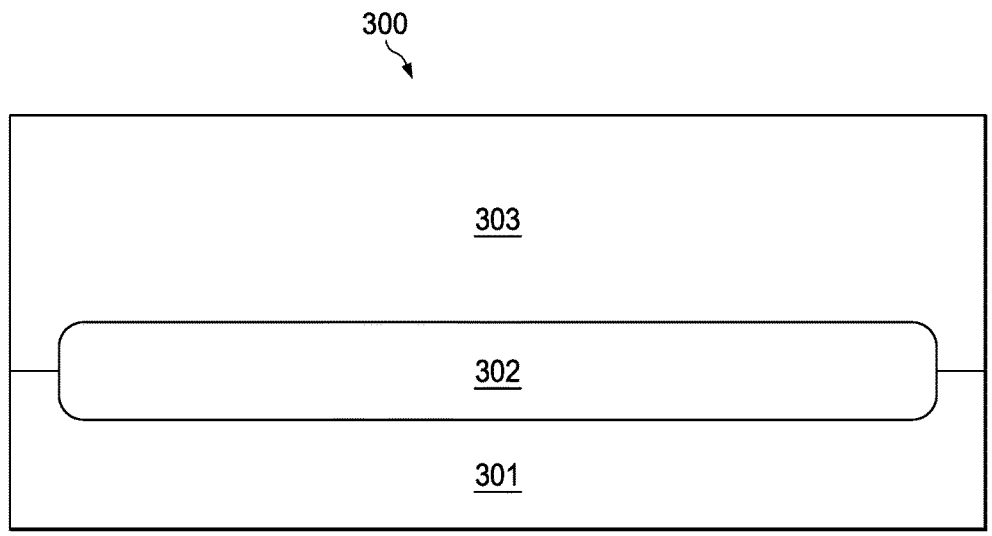
FIGS. 3A-3D illustrate the fabrication steps required to fabricate the IMPATT diode of FIG. 3 according to an embodiment of the present invention.

Turning to FIG. 3A, the process begins by providing a substrate composed of p-type single crystal silicon 301, then forming an n-type buried (NBL) layer 302 overlaying and touching the top surface of the substrate as shown in FIGS. 3-8, and then epitaxially depositing an un-doped layer (EPI) 303 overlaying and touching the top surface of the NBL layer 302. In this embodiment, substrate 301 is p-type silicon wafer. Note that an IMPATT diode may be built on substrate of other group IV elements or compound semiconductor materials such as gallium arsenide and mercury telluride. The substrate may be mono-crystalline or polycrystalline. It may be a bonded wafer where a layer of insulator is bonded to layers of semiconductor material.

Also depicted in FIG. 3A is a NBL layer 302. The NBL layer is usually a heavily doped, mono-crystalline silicon layer, and this layer serves as low-resistance current path between the drift layer 307 and the sinker layer 306. The drift layer 307 and the sinker layer 306 will be discussed in a later section. In a high-performance bipolar or Bi-CMOS integrated-circuit chip, an NBL layer is usually present for other circuit considerations. Note that a second, p-type buried layer may be incorporated atop the NBL layer for building a p-type IMPATT diode in a p-type substrate. In many circuit applications, having a second buried layer is advantageous since the avalanche noise within the IMPATT diode will not interfere with the components in surrounding environment.

Also depicted in FIG. 3A is an epitaxial layer 303 which is an un-doped mono-crystalline silicon layer with high resistivity. In this embodiment, the entire device 300 is mono-crystalline. Note that an IMPATT diode may also be built with poly-crystalline material in the breakdown layer 308, drift layer 307, and sinker layer 306, although mono-crystalline material tends to have some physical properties such as charge carrier mobility that are superior to those associated with polycrystalline material. The breakdown layer 308, drift layer 307, and sinker layer 306 will be discussed in a later section.

Figure 3B:
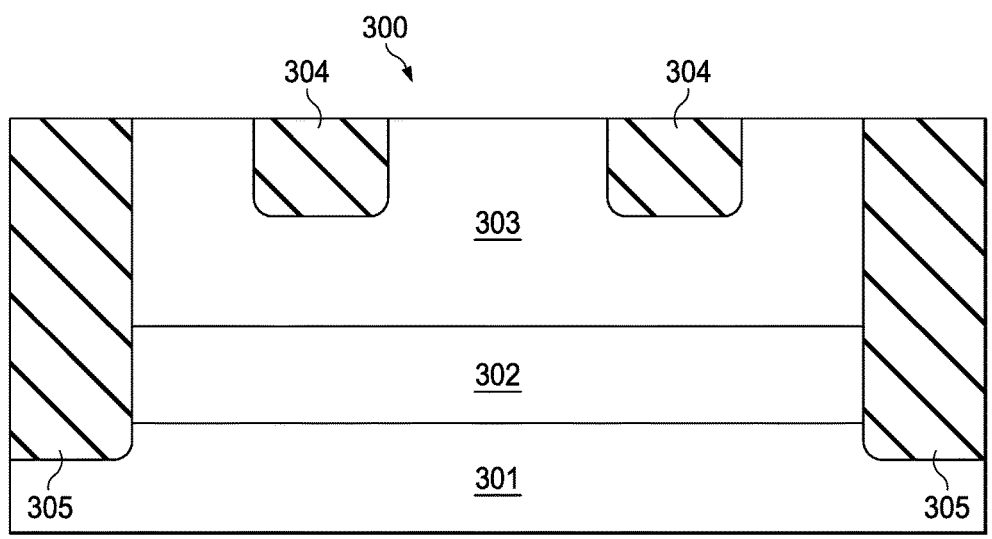

Turning to FIG. 3B, the process is followed by forming a field oxide layer 304 covering the top surface of the wafer, wherein openings are included to provide for drift layers 307 under the breakdown layer 308 and the N++ sinker opening 306 of the IMPATT diode. The drift layer 307 and breakdown layer 308 will be discussed in a later section. The field oxide layer 304 is typically silicon dioxide between 250 and 600 nanometers thick, commonly formed preferably by shallow trench isolation (STI) process, or possibly by local oxidation of silicon (LOCOS) processes. The STI layer 304 electrically isolates the sinker layer 306 from breakdown layer 308.

Also depicted in FIG. 3B, the process is then followed by forming another field oxide layer 305 extending from the top surface of the un-doped EPI layer 303 down to the substrate and completely surrounding the IMPATT diode, thereby separating the diode from the rest of the elements in an analog circuit. The field oxide layer 305 is typically silicon dioxide between 1 and 10 micrometers thick, commonly formed preferably by deep trench isolation (DT) process. With the DT layer 305, the IMPATT diode 300 is electrically isolated from other electrical components, and is communicable to other circuit elements of an integrated circuit through metallic leads 401. The metallic lead 401 will be discussed in a later section.

Figure 3C:
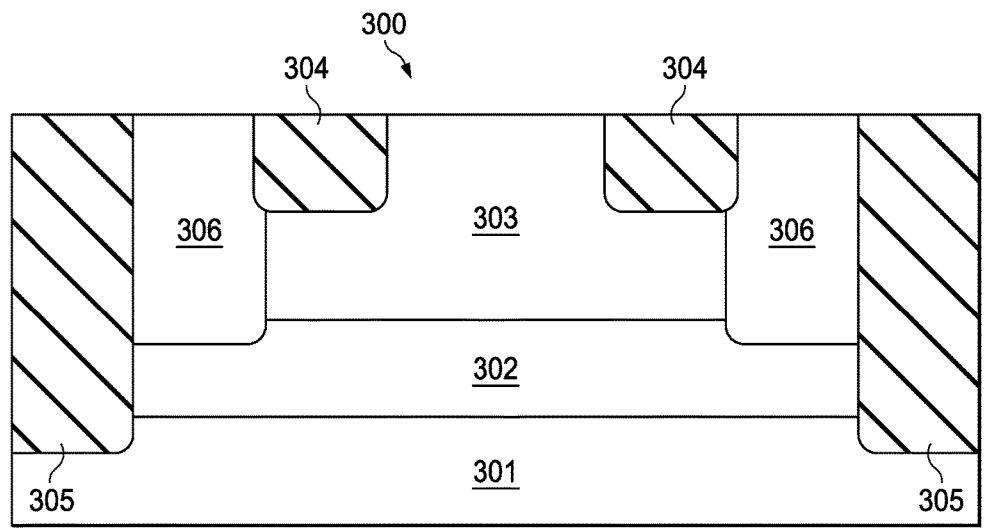

Turning to FIG. 3C, the process is followed by forming a deep N++ sinker layer 306 through the N++ opening surrounded by the STI layer 304, partially separated from the breakdown layer 308 by the STI layer 304 and a portion of the un-doped EPI layer 303, wherein the deep N++ sinker layer 306 extends through the un-doped EPI layer 303 and touches the top surface of the NBL layer 302. The sinker layer 306 is an n-type layer, which is heavily doped, mono-crystalline silicon layer. It creates a low resistive path between the underneath NBL layer 302 and top metallic leads 401. The metallic lead 401 will be discussed in a later section.

Figure 3D:
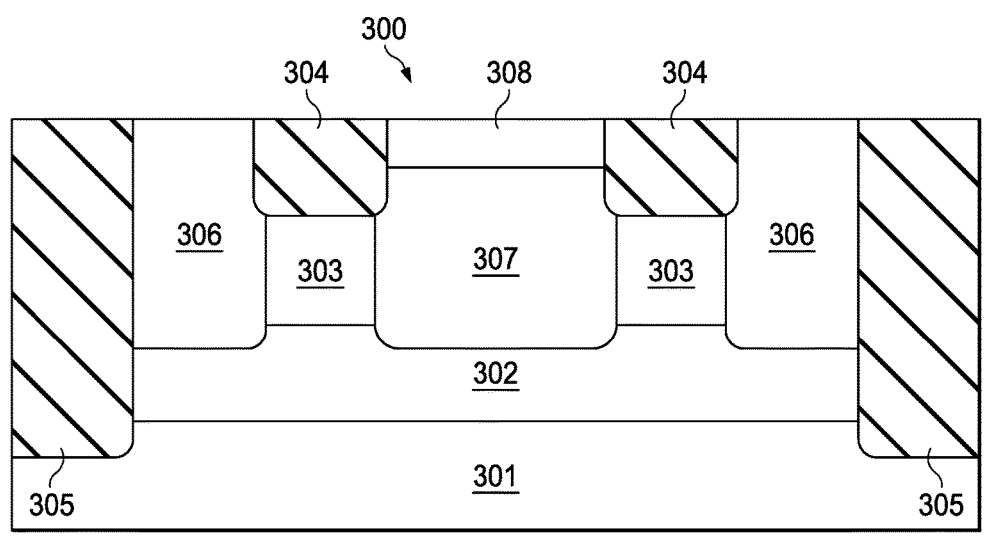

Turning to FIG. 3D, the process is followed by forming a drift layer 307 through the opening in the STI layer 304, wherein the drift layer 307 extends through the un-doped EPI layer 303 and touches the top surface of the NBL layer 302. The drift layer 307 is an n-type layer, which is lightly doped, mono-crystalline silicon layer. When the IMPATT diode is reverse biased, the free charge is depleted from the drift layer 307, and high electrical field is built up in this drift layer. On one hand, the electrical field in the drift layer 307 is high enough that charges will move at their saturation velocity from the breakdown layer 308 to the NBL layer 302. The breakdown layer 308 will be discussed in a later section. On the other hand, the electrical field in the drift region 307 is low enough that no additional avalanche breakdown will occur in this drift layer.

Also depicted in FIG. 3D, the process is followed by forming a breakdown layer 308 touching the top of the drift layer 307. The breakdown layer 308 is a p-type layer, which is heavily doped, mono-crystalline silicon layer. Since the drift layer 307 and the sinker layer 306 are doped with n-type dopant, the same doping polarity as that in the NBL layer, there exists a p-n junction at the intersection between the breakdown layer 308 and the drift layer 307, while the intersections between the NBL layer 302 and the drift layer 307 and the sinker layer 306 will be Oohmic. When the diode is reverse biased, the electrical field at the p-n junction described above is high enough that breakdown will occur. Charges will be generated in this breakdown layer 308, by either avalanche breakdown or tunneling breakdown, or mixed avalanche-tunneling breakdown. Since the electric field in the drift layer 307 is high enough, the electrons created by the avalanche process will drift at their saturation velocity across the drift layer 307. Since the epitaxial layer 303 is un-doped, there exists a potential barrier to prevent the current flow directly from the drift layer 307 to the sinker layer 306. In addition, the sinker layer 306 is electrically isolated from the breakdown layer 308 by the STI layer 304. Therefore the electrons created by the breakdown process will drift through the whole drift layer 307, providing necessary transit-time and creating phase delay between the AC current and the AC voltage. After drifting across the drift layer 307, the electrons will flow through the low resistive paths from the NBL layer 302 and sinker layer 306, and reach the top metallic leads 401. The metallic lead 401 will be discussed in a later section.

The process steps described above are only a portion of the total manufacturing process with which to make an n-type IMPATT diode embodying this invention. FIG. 3 further depicts a portion of the metallic-lead structure associated with the IMPATT diode where elements 401 are the first metal level and elements 402 are the first inter-level dielectric material. Not shown in FIG. 3 are regions of silicidation, which are commonly employed in the art for reducing the contact resistance between the semiconductor material and the metallic leads 401. Refractory metals such as nickel, titanium and cobalt are commonly employed in the silicidation process.

The doping of the various layers listed above may be implemented by ion-implant techniques, diffusion techniques, or other techniques known in the art of semiconductor processing. In this embodiment of FIG. 3, the NBL layer 302 is heavily doped, so are the sinker layer 306 and breakdown layer 308. The drift layer 307 is generally doped more lightly than the breakdown layer 308 and the NBL layer 302, in order to deplete the free charge in the drift layer and create necessary high electric field for the charges to transport at their saturation velocity.

Figure 4:
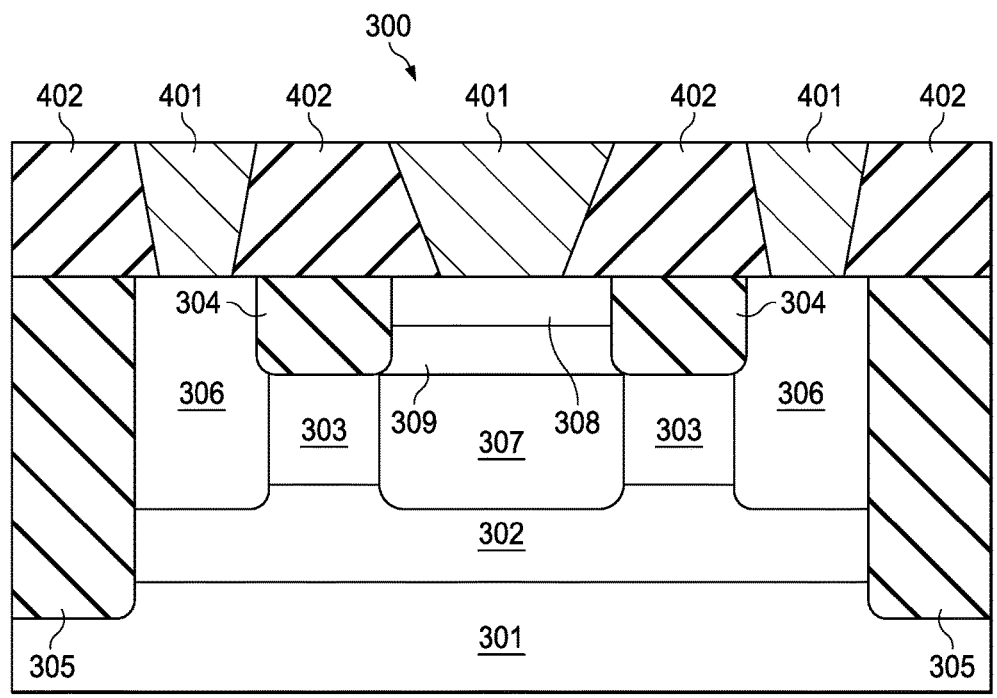
FIG. 4 is a cross section through section A-A of FIG. 2 of an IMPATT diode according to another embodiment of the present invention.

FIG. 4 depicts an alternative approach to implement IMPATT diode, where a heavily doped $N^{++}$ mono-crystalline silicon layer 309 is formed between the breakdown layer 308 and the drift layer 307. With this additional $N^{++}$ layer 309, the electrical field at the p-n junction between the layers 308 and 309 can be independently adjusted to create desired breakdown composition between avalanche and tunneling, and therefore create preferred device noise performance. In addition, the electrical field in the drift layer 307 can be reduced to minimize the chance of additional breakdown in the drift layer 307.

Figure 5:
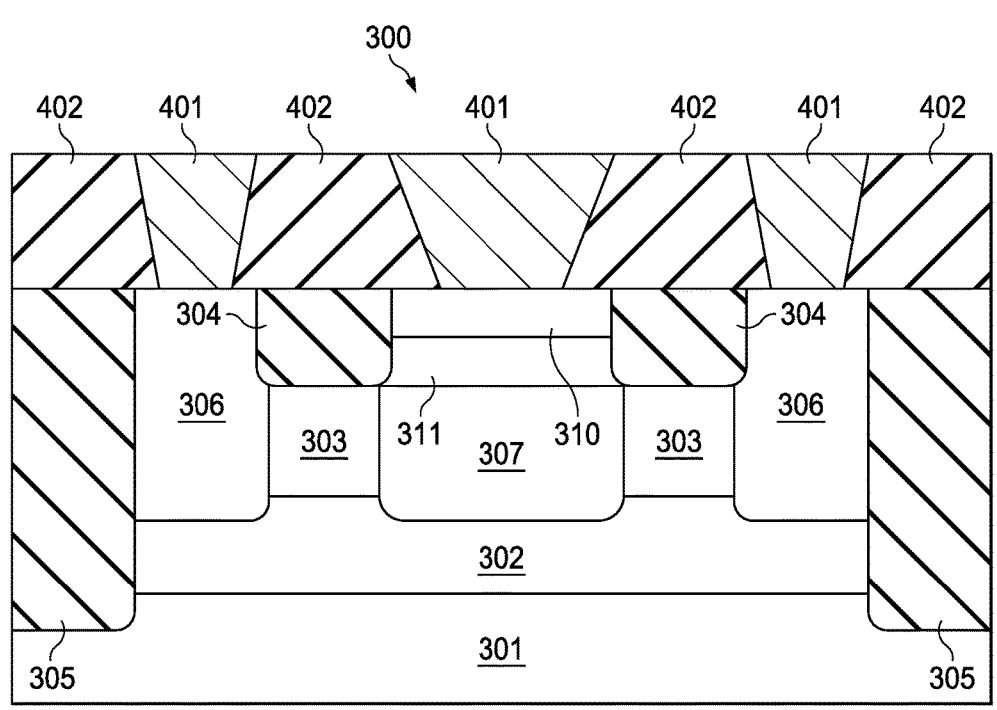
FIG. 5 is a cross section through section A-A of FIG. 2 of an IMPATT diode according to another embodiment of the present invention.

FIG. 5 depicts another approach to implement IMPATT diode where both N-type and P-type SiGe heterostructures are available. The heavily doped breakdown layers 308 and 309 in FIG. 4 can be replaced with a heavily doped $P^{++}$ SiGe layer 310 and $N^{++}$ SiGe layer 311, respectively. Because the SiGe material has smaller bandgap, the electrical properties, especially the avalanche breakdown and tunneling breakdown, will be different from that of the bulk mono-crystalline silicon. It requires less electrical field to create either avalanche breakdown or tunneling breakdown within the SiGe layers 310 and 311. Such feature is advantages since the breakdown will be confined within the narrow bandgap SiGe layer, and the doping requirement for the drift layer 307 is relaxed.

Figure 6:
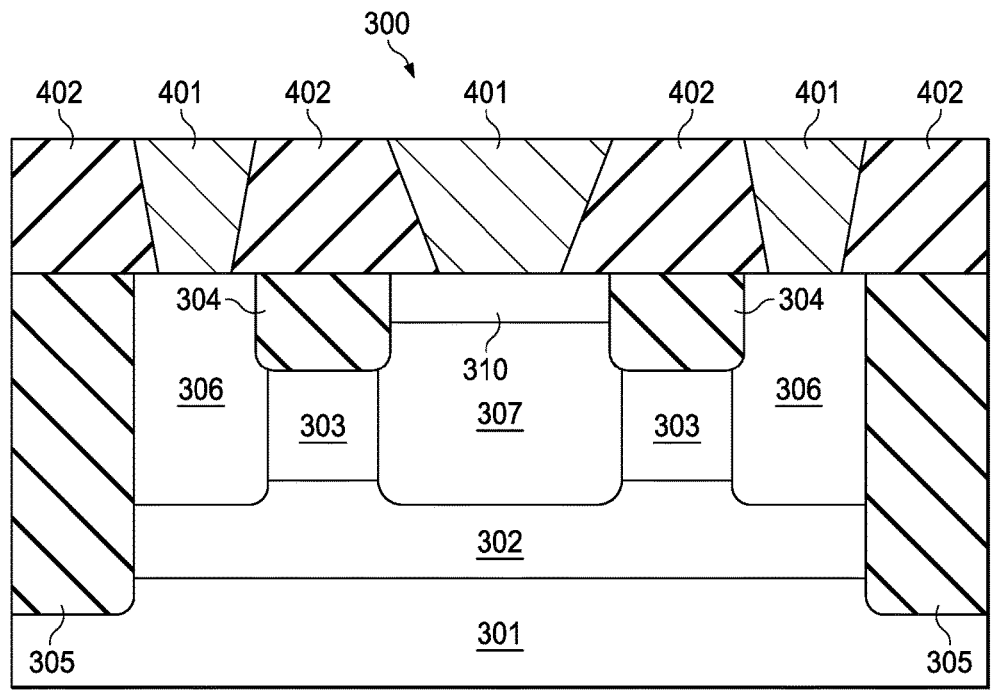
FIG. 6 is a cross section through section A-A of FIG. 2 of an IMPATT diode according to another embodiment of the present invention.

FIG. 6 depicts another approach to implement IMPATT diode where only P-type SiGe material is available. The $P^{++}$ breakdown layer 308 in FIG. 3 is replaced with the $P^{++}$ SiGe breakdown layer 310. With proper design, the breakdown will be confined within the $P^{++}$ SiGe breakdown layer 310, and doping requirement for the drift layer 307 is relaxed.

Figure 7:
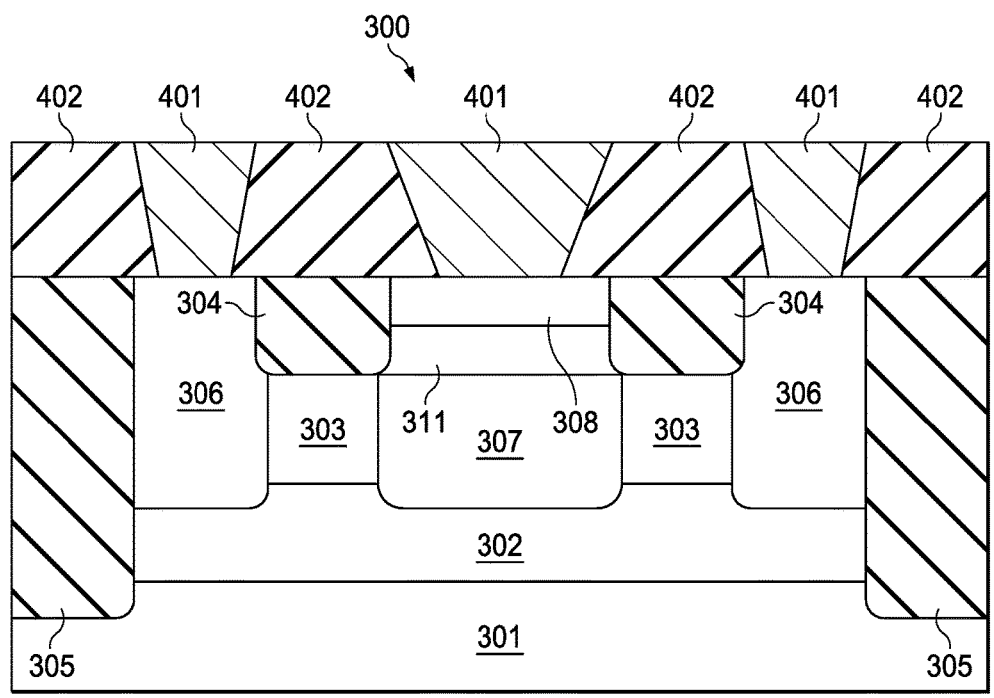
FIG. 7 is a cross section through section A-A of FIG. 2 of an IMPATT diode according to another embodiment of the present invention.

FIG. 7 depicts another approach to implement IMPATT diode where only N-type SiGe material is available. The $N^{++}$ breakdown layer 309 in FIG. 4 is replaced with the $N^{++}$ SiGe breakdown layer 311. In this case, the breakdown will be confined within both the $P^{++}$ breakdown layer 308 and the $N^{++}$ SiGe breakdown layer 311. Compared to the example in FIG. 4, the doping requirement for the drift layer 307 is relaxed.

Figure 8:
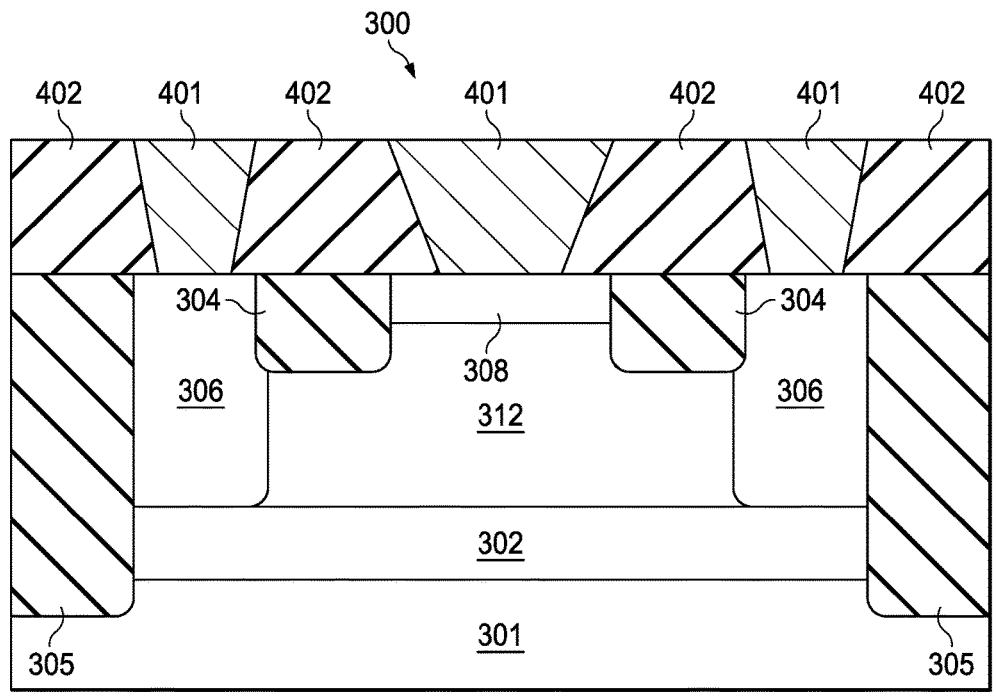
FIG. 8 is a cross section through section A-A of FIG. 2 of an IMPATT diode according to another embodiment of the present invention.

A modified process can be used to design a lateral IMPATT diode, as in FIG. 8. In this implementation, the epitaxial layer 312 is doped with n-type, and current will flow under the STI layer 304 and through the n-type EPI layer 312 rather than through the NBL layer 302 as in FIG. 3. The advantage of such structure is that the diode operation frequency, as defined by the thickness of the drift layer 307 as in FIG. 3, is now controlled by the width of the STI layer 304 through lithography. Since the thickness of the drift layer 307 is usually fixed, the lateral example in FIG. 8 is more flexible to design diode oscillation frequency by designing the width of the STI layer 304 through lithography. Multiple oscillators at varies frequencies can be implemented on the same technology. Still the p-n junction field between the breakdown layer 308 and the drift layer 312 is uniform which is necessary to control the avalanche breakdown.

Figure 9:
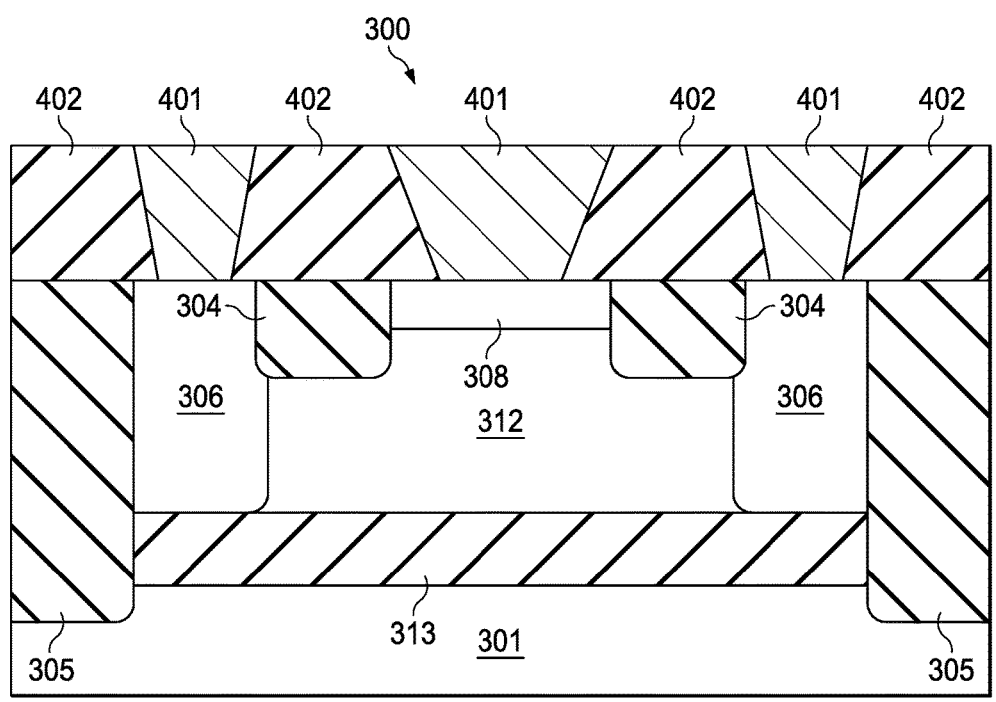
FIG. 9 is a cross section through section A-A of FIG. 2 of an IMPATT diode according to another embodiment of the present invention.

FIG. 9 depicts another approach to implement a lateral IMPATT diode, where the buried NBL layer 302 is replaced with a buried oxide layer 313. Since the current flows under the STI layer 304 and through the n-type EPI layer 312 rather than through the NBL layer 302 as in FIG. 3, there is no electrical benefit to keep the NBL layer 302. The advantage of such structure is that the diode is isolated from rest of component by the buried oxide layer 313 and the DT layer 305, and the avalanche noise within the IMPATT diode will not interfere with the components in surrounding environment. Still the p-n junction field between the breakdown layer 308 and the drift layer 312 is uniform which is necessary to control the avalanche breakdown.

The advantage the present invention is that it presents new device architectures which allow silicon IMPATT diodes to be integrated into an analog process.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An IMPATT diode, comprising:
   a substrate;
   a p-type region and an n-type region that are vertically arranged on the substrate, the n-type region including a lightly doped n-type layer and a heavily doped n-type layer, the p-type region and the lightly doped n-type layer being in contact with each other and forming an IMPATT diode junction;
   a vertical access to the highly doped n-type region;
   an isolation structure disposed between and configured to isolate the vertical access and the p-type region; and
   two Ohmic contacts, on a top surface of the IMPATT diode, electrically coupled to the vertical access and the p-type region from the top surface of the IMPATT diode.

2. The diode of claim 1, further comprising:
   an un-doped layer extending below the isolation structure, the un-doped layer interposed between the vertical access and the light doped n-type layer.

3. The diode of claim 1, further comprising:
   a deep trench isolation structure laterally surrounding the n-type region and extending to the substrate.

4. The diode of claim 1, further comprising:
   a buried oxide layer interposed between the n-type region and the substrate.

5. The diode of claim 1, wherein the p-type region includes a p-doped SiGe layer interfacing with the n-type region.

6. The diode of claim 1, wherein the n-type region includes an n-doped SiGe layer interfacing the bottom surface of the p-type region.

7. The diode of claim 1, wherein the n-type region includes a vertical portion interfacing with the bottom surface of the p-type region, the vertical portion having a lower doping concentration than the p-type region.

8. The diode of claim 1, wherein the n-type region includes:
   a first vertical portion laterally surrounding the isolation structure;
   a buried layer positioned on the substrate and under the p-type region, the buried layer contacting the first vertical portion; and
   a second vertical portion laterally surrounded by the isolation structure and the first vertical portion, the second vertical portion vertically interposed between the buried layer and the p-type region, the second vertical portion interfacing with the bottom surface of the p-type region.

9. The diode of claim 8, wherein the second vertical portion is separated from the first vertical portion.

10. The diode of claim 8, wherein the second vertical portion contacts the first vertical portion.

11. A method of making an IMPATT diode, comprising:
providing a substrate;
providing a p-type region and an n-type region that are vertically arranged on the substrate, the n-type region including a lightly doped n-type layer and a heavily doped n-type layer, the p-type region and the lightly doped n-type layer being in contact with each other and forming an IMPATT diode junction;
providing a vertical access to the highly doped n-type region;
providing an isolation structure disposed between and configured to isolate the vertical access and the p-type region; and
providing two Ohmic contacts, on a top surface of the IMPATT diode, electrically coupled to the vertical access and the p-type region from the top surface of the IMPATT diode.

12. The method of claim 11, further comprising
providing an un-doped layer extending below the isolation structure, the un-doped layer interposed between the vertical access and the light doped n-type layer.

13. The method of claim 11, further comprising
providing a deep trench isolation structure laterally surrounding the n-type region and extending to the substrate.

14. The method of claim 11, further comprising
a buried oxide layer interposed between the n-type region and the substrate.

15. The method of claim 11, wherein the p-type region includes a p-doped SiGe layer interfacing with the n-type region.

16. The method of claim 11, wherein the n-type region includes an n-doped SiGe layer interfacing the bottom surface of the p-type region.

17. The method of claim 11, wherein the n-type region includes a vertical portion interfacing with the bottom surface of the p-type region, the vertical portion having a lower doping concentration than the p-type region.

18. The method of claim 11, wherein the n-type region includes:
a first vertical portion laterally surrounding the isolation structure;
a buried layer positioned on the substrate and under the p-type region, the buried layer contacting the first vertical portion; and
a second vertical portion laterally surrounded by the isolation structure and the first vertical portion, the second vertical portion vertically interposed between the buried layer and the p-type region, the second vertical portion interfacing with the bottom surface of the p-type region.

19. The method of claim 18, wherein the second vertical portion is separated from the first vertical portion.

\* \* \* \* \*